(12) United States Patent
Lee et al.

(10) Patent No.: US 7,863,607 B2
(45) Date of Patent: Jan. 4, 2011

(54) THIN FILM TRANSISTOR ARRAY PANEL AND MANUFACTURING METHOD THEREOF

(75) Inventors: Je-Hun Lee, Seoul (KR); Do-Hyun Kim, Seoul (KR); Chang-Oh Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 398 days.

(21) Appl. No.: 11/980,871

(22) Filed: Oct. 30, 2007

(65) Prior Publication Data

US 2008/0308795 A1   Dec. 18, 2008

(30) Foreign Application Priority Data

Jun. 14, 2007   (KR) ...................... 10-2007-0058216

(51) Int. Cl.
*H01L 29/786* (2006.01)
(52) U.S. Cl. .............................. 257/43; 257/72; 349/43
(58) Field of Classification Search .................... 257/43
See application file for complete search history.

(56) References Cited

U.S. PATENT DOCUMENTS

| | | | | |
|---|---|---|---|---|
| 6,781,152 | B2 * | 8/2004 | Yamazaki ..................... | 257/59 |
| 7,050,137 | B2 * | 5/2006 | Hoshino et al. ............. | 349/149 |
| 7,145,174 | B2 | 12/2006 | Chiang et al. | |
| 7,211,825 | B2 * | 5/2007 | Shih et al. ..................... | 257/72 |
| 2005/0017244 | A1 | 1/2005 | Hoffman et al. | |
| 2005/0199881 | A1 | 9/2005 | Hoffman et al. | |
| 2005/0199967 | A1 | 9/2005 | Hoffman | |

FOREIGN PATENT DOCUMENTS

| | | |
|---|---|---|
| JP | 2002-289859 | 10/2002 |
| JP | 2003-37268 | 2/2003 |
| JP | 2003-50405 | 2/2003 |
| JP | 2004-6686 | 1/2004 |
| JP | 2004-193446 | 7/2004 |
| JP | 2004-235180 | 8/2004 |

(Continued)

OTHER PUBLICATIONS

Patent Abstracts of Japan, Publication No. 2002-289859, Oct. 04, 2002, 2 pp.

(Continued)

*Primary Examiner*—Jerome Jackson, Jr.
(74) *Attorney, Agent, or Firm*—Innovation Counsel LLP

(57) ABSTRACT

The disclosed thin film transistor array panel includes an insulating substrate, a channel layer including an oxide formed on the insulating substrate. A gate insulating is layer formed on the channel layer and a gate electrode is formed on the gate insulating layer. An interlayer insulating layer is formed on the gate electrode and a data line formed on the interlayer insulating layer and includes a source electrode, wherein the data line is made of a first conductive layer and a second conductive layer. A drain electrode formed on the interlayer insulating layer, and includes the first conductive layer and the second conductive layer. A pixel electrode extends from the first conductive layer of the drain electrode and a passivation layer formed on the data line and the drain electrode. A spacer formed on the passivation layer.

18 Claims, 21 Drawing Sheets

FOREIGN PATENT DOCUMENTS

| | | |
|---|---|---|
| JP | 2006-165529 | 6/2006 |
| JP | 2006-173580 | 6/2006 |
| JP | 2006-245105 | 9/2006 |
| JP | 2006-269469 | 10/2006 |
| KR | 2002-0038482 | 5/2002 |
| KR | 2003-0048012 | 6/2003 |
| KR | 2004-0062193 | 7/2004 |
| KR | 10-0615233 | 1/2006 |
| KR | 2006-0000595 | 1/2006 |
| KR | 2006-0020156 | 3/2006 |
| KR | 2006-0066064 | 6/2006 |
| KR | 2006-0123765 | 12/2006 |

OTHER PUBLICATIONS

Patent Abstracts of Japan, Publication No. 2003-037268, Feb. 07, 2003, 2 pp.

Patent Abstracts of Japan, Publication No. 2003-050405, Feb. 21, 2003, 2 pp.

Patent Abstracts of Japan, Publication No. 2004-006686, Jan. 08, 2004, 2 pp.

Patent Abstracts of Japan, Publication No. 2004-193446, Jul. 08, 2004, 2 pp.

Patent Abstracts of Japan, Publication No. 2004-235180, Aug. 19, 2004, 2 pp.

Patent Abstracts of Japan, Publication No. 2006-165529, Jun. 22, 2006, 2 pp.

Patent Abstracts of Japan, Publication No. 2006-173580, Jun. 29, 2006, 2 pp.

Patent Abstracts of Japan, Publication No. 2006-245105, Sep. 14, 2006, 2 pp.

Patent Abstracts of Japan, Publication No. 2006-269469, Oct. 05, 2006, 2 pp.

Korean Patent Abstracts, Publication No. 1020020038482, May 23, 2002, 2 pp.

English Language Abstract, Publication No. WO0217368, corresponding to Korean Publication No. 2003-0048012, Jun. 18, 2003, 2 pp.

Korean Patent Abstracts, Publication No. 1020040062193, Jul. 07, 2004, 2 pp.

Korean Patent Abstracts, Publication No. 1020060000595, Jan. 06, 2006, 2 pp.

Korean Patent Abstracts, Publication No. 1020060008526, Jan. 27, 2006, 2 pp.

Korean Patent Abstracts, Publication No. 1020060020156, Mar. 06, 2006, 2 pp.

English Language Abstract, Publication No. WO2005015643, corresponding to Korean Publication No. 2006-0066064, Jun. 15, 2006, 2 pp.

English Language Abstract, Publication No. WO2005088726, corresponding to Korean Publication No. 2006-0123765, Dec. 04, 2006, 2 pp.

* cited by examiner

THIN FILM TRANSISTOR ARRAY PANEL AND MANUFACTURING METHOD THEREOF

CROSS-REFERENCE TO RELATED APPLICATION

This application claims priority to and the benefit of Korean Patent Application No. 10-2007-0058216 filed in the Korean Intellectual Property Office on Jun. 14, 2007, the entire contents of which are incorporated herein by reference.

BACKGROUND OF THE INVENTION (a) Field of the Invention

The present invention relates to a thin film transistor array panel and a manufacturing method thereof.

(b) Description of the Related Art

Generally, a thin film transistor is used as a switching element for independently driving each pixel in a flat panel display, such as a liquid crystal display and an organic light emitting display device. A thin film transistor array panel including the thin film transistors has scanning signal lines (or gate lines) for transmitting scanning signals to the thin film transistors, and data lines for transmitting data signals to the thin film transistors, as well as pixel electrodes connected to the thin film transistors.

Each thin film transistor includes a gate electrode connected to a gate line, a source electrode connected to a data line, a drain electrode connected to a pixel electrode and a source electrode, and a channel layer formed on the gate electrode between the source electrode and the drain electrode, and transmits a data signal from the data line to the pixel electrode according to the scanning signal from the gate line.

Here, the channel layer of the thin film transistor is preferably made of polysilicon (polycrystalline silicon, polysilicon), amorphous silicon, or an oxide semiconductor.

Recently, research of an oxide semiconductor has been actively developed. The oxide semiconductor may be deposited at room temperature, and has good uniformity in comparison with polysilicon and higher current mobility in comparison with amorphous silicon.

When forming the thin film transistor semiconductor with a bottom gate structure using the oxide semiconductor, the oxide semiconductor may be exposed to the atmosphere and the channel portion of the oxide semiconductor may be damaged by vapor or by the dry etch gas when etching a metal layer formed on the oxide semiconductor, and accordingly the characteristics of the thin film transistor may be seriously degraded. Furthermore, to prevent damage by the dry etching as above described, a wet etching method may be used. However, it is difficult to form the thin film transistor when the etching speed for the oxide semiconductor is higher than that of the upper metal layer.

The above information disclosed in this Background section is only for enhancement of understanding of the background of the invention and therefore it may contain information that does not form the prior art that is already known in this country to a person of ordinary skill in the art.

SUMMARY OF THE INVENTION

A thin film transistor array panel according to an exemplary embodiment of the present invention is provided that includes: an insulating substrate; a channel layer formed on the insulating substrate and including an oxide; a gate insulating layer formed on the channel layer; a gate electrode formed on the gate insulating layer; an interlayer insulating layer formed on the gate electrode; a data line formed on the interlayer insulating layer and including a source electrode, wherein the data line is made of a first conductive layer and a second conductive layer; a drain electrode formed on the interlayer insulating layer and including the first conductive layer and the second conductive layer; a pixel electrode extended from the first conductive layer of the drain electrode, a passivation layer formed on the data line and the drain electrode, and a spacer formed on the passivation layer.

The passivation layer may be extended according to the data line, and includes a protruded portion covering the drain electrode.

The spacer may have the same planar shape as the passivation layer.

A portion of the spacer disposed on the data line may be partially removed such that a portion of the passivation layer may be exposed.

The gate insulating layer may substantially have the same planar as the channel layer.

The gate line is disposed on the gate insulating layer.

A storage electrode line formed on the substrate, except on the gate insulating layer, and intersecting the data line may be further included.

A color filter formed on the pixel electrode may be further included.

Alternatively, a color filter formed between the interlayer insulating layer and the pixel electrode or a color filter formed between the substrate and the channel layer may be further included.

The gate insulating layer may substantially have the same planar shape as the channel layer.

The gate line may be disposed on the gate insulating layer.

A storage electrode line formed on the substrate, except on the gate insulating layer, and intersecting the data line may be further included.

A color filter formed on the pixel electrode may be further included.

Alternatively, a color filter formed between the interlayer insulating layer and the pixel electrode or a color filter formed between the substrate and the channel layer may be further included.

The first conductive layer of the data line and the drain electrode and the pixel electrode may be made of a transparent conducting oxide including at least one of indium (In), zinc (Zn), tin (Sn), aluminum (Al), or gallium (Ga).

The second conductive layer of the data line and the drain electrode includes at least one of aluminum, molybdenum, silver, copper, chromium, tungsten, niobium, titanium, and tantalum.

A thin film transistor array panel according to another exemplary embodiment of the present invention is provided that includes: an insulating substrate; a channel layer formed on the insulating substrate and including an oxide; a gate insulating layer formed on the channel layer; a gate line formed on the gate insulating layer; an interlayer insulating layer formed on the gate line; a data line including a source electrode and a drain electrode formed on the interlayer insulating layer; a pixel electrode formed on the interlayer insulating layer and connected to the drain electrode; a passivation layer formed on the data line and the drain electrode; and a spacer formed on the passivation layer. The passivation layer is extended according to the data line and includes a protruded portion covering the drain electrode.

The spacer may have the substantially same planar shape as the passivation layer.

The spacer disposed on the data line may be partially removed such that a portion of the passivation layer is exposed.

A manufacturing method of a thin film transistor array panel according to an exemplary embodiment of the present invention is provided that includes: forming a channel layer including an oxide on an insulating substrate; forming a gate insulating layer covering the channel layer; forming a gate line including a gate electrode on the gate insulating layer; forming an interlayer insulating layer on the gate line; forming a plurality of contact holes exposing portions of the channel layer in the interlayer insulating layer and the gate insulating layer; forming a data line including a source electrode, a drain electrode, and a pixel electrode connected to the drain electrode on the interlayer insulating layer; forming an insulating layer on the data line, the drain electrode, and the pixel electrode; forming a spacer on the insulating layer; and etching the insulating layer using the spacer as an etching mask to form a passivation layer exposing the pixel electrode. The forming of the data line, the drain electrode, and the pixel electrode on the interlayer insulating layer may include: sequentially depositing the first conductive layer and the second conductive layer; forming a first photosensitive film pattern having a different thickness according to the position on the second conductive layer; etching the second conductive layer and the first conductive layer using the first photosensitive film pattern as an etching mask; ashing the first photosensitive film pattern to form the second photosensitive film pattern exposing the second conductive layer; and etching the second conductive layer using the second photosensitive film pattern as an etching mask.

Forming the channel layer and the gate insulating layer may include sequentially depositing an oxide semiconductor layer and an insulating layer on the insulating substrate, and then simultaneously etching the insulating layer and the oxide semiconductor layer. Forming the spacer may include forming a photosensitive film on the insulating layer, exposing the photosensitive film using a half tone mask, and developing the exposed the photosensitive film to form a spacer having a first portion disposed on the data line and a second portion having a thicker thickness than the first portion.

A color filter may be formed on the pixel electrode.

Alternatively, a color filter may be formed between the interlayer insulating layer and the data line and pixel electrode, or a color filter may be formed before forming the channel layer.

A manufacturing method according to another exemplary embodiment of the present invention is provided that includes: forming a channel layer including an oxide on an insulating substrate; forming a gate insulating layer covering the channel layer; forming a gate line including a gate electrode on the gate insulating layer; forming an interlayer insulating layer on the gate line; forming a plurality of contact holes exposing portions of the channel layer in the interlayer insulating layer and the gate insulating layer; sequentially depositing a first conductive layer and a second conductive layer on the interlayer insulating layer; forming a first photosensitive film pattern having a different thickness according to the position on the second conductive layer; etching the second conductive layer and the first conductive layer using the first photosensitive film pattern as an etching mask to form a data line including a source electrode, a drain electrode, and a previous pixel electrode connected to the drain electrode; ashing the first photosensitive film pattern to form the second photosensitive film pattern exposing the second conductive layer of the previous pixel electrode; etching the second conductive layer using the second photosensitive film pattern as an etching mask to form a pixel electrode; forming a passivation layer on the data line, the drain electrode, and the pixel electrode; and forming a spacer on the passivation layer.

BRIEF DESCRIPTION OF THE DRAWINGS

FIG. 19 is a layout view of a thin film transistor array panel according to an embodiment of the present invention.

DETAILED DESCRIPTION OF THE EMBODIMENTS

Figure 1:
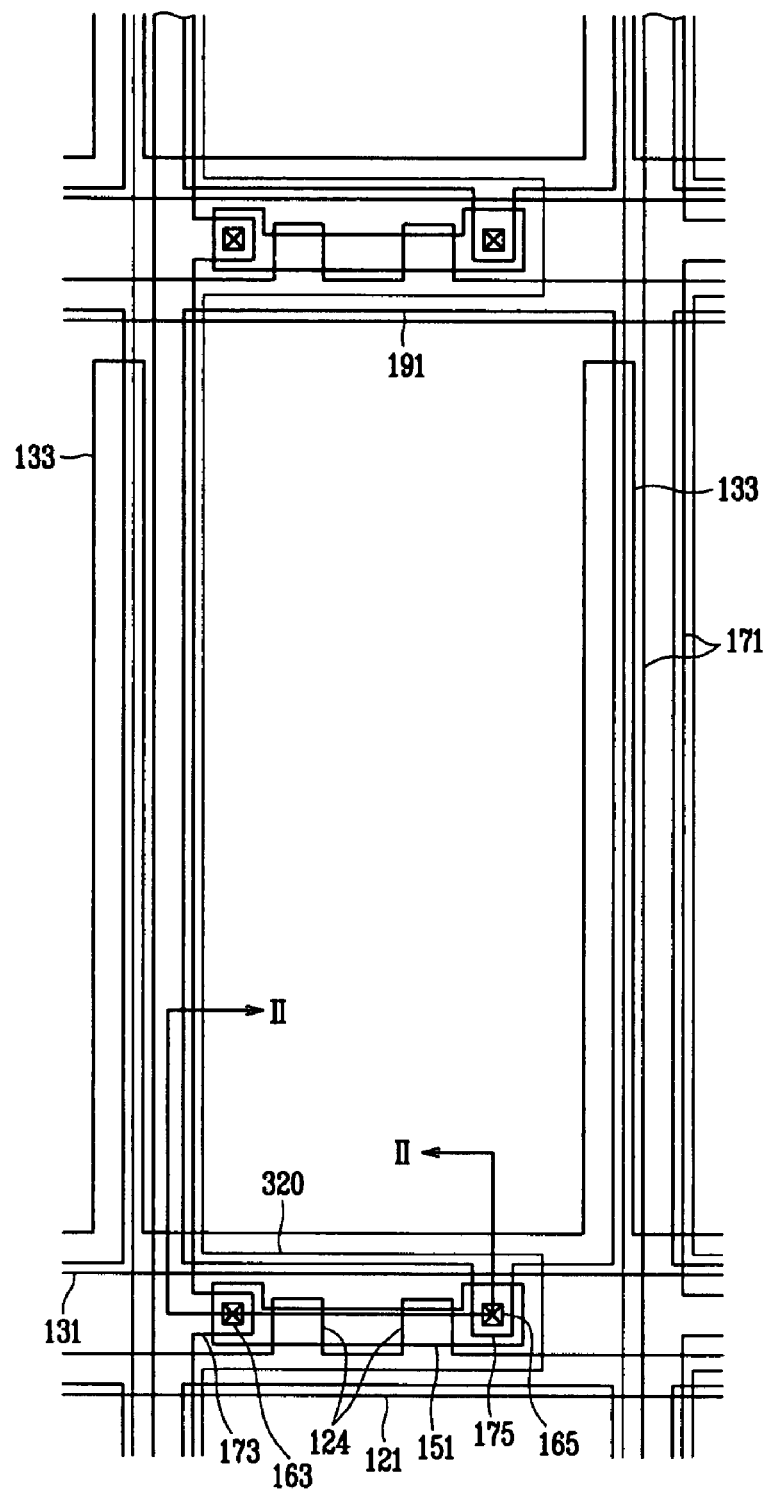
FIG. 1 is a layout view of a thin film transistor array panel according to a first exemplary embodiment of the present invention.

The present invention is described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Exemplary Embodiment 1

Figure 2:
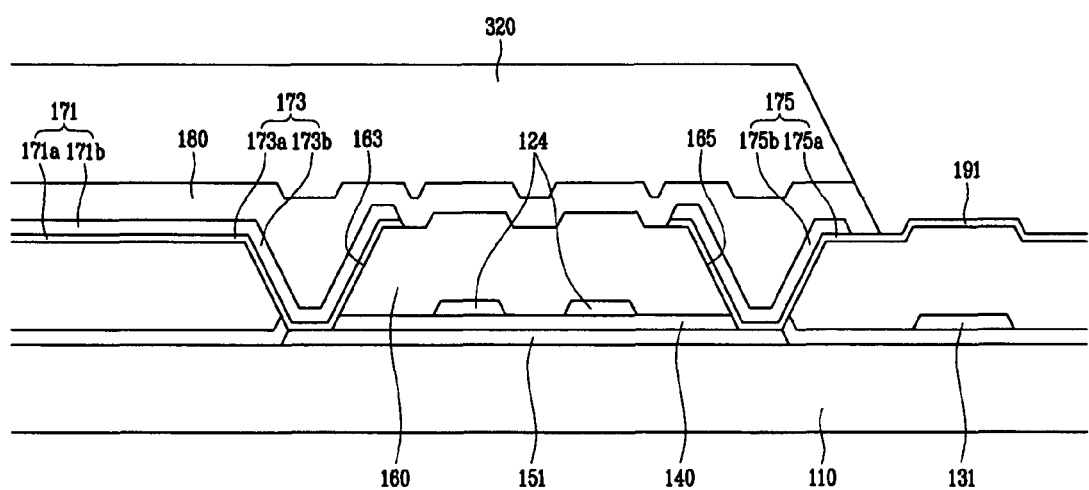
FIG. 2 is a cross-sectional view of the thin film transistor array panel shown in FIG. 1 taken along the line II-II.

FIG. 1 is a layout view of a thin film transistor array panel according to a first exemplary embodiment of the present invention, and FIG. 2 is a cross-sectional view of the thin film transistor array panel shown in FIG. 1 taken along the line II-II.

A plurality of channel layers 151 are formed on an insulating substrate 110 made of a material such as transparent glass or plastic. The channel layers 151 are extended in the transverse direction with an island shape, and their both ends have a wide area for contacting with another layer.

A blocking film (not shown) preferably made of silicon oxide ($SiO_2$) may be formed between the channel layers 151 and the substrate 110 for preventing the impurities of the substrate 110 from diffusing and penetrating into the channel layers 151.

The channel layers 151 are preferably made of an oxide semiconductor material which includes an oxide substance such as zinc (Zn), gallium (Ga), tin (Sn), or indium (In), and an oxide compound oxide substance such as zinc oxide (ZnO), indium-gallium-zinc oxide ($InGaZnO_4$), indium-zinc oxide (Zn—In—O), or zinc-tin oxide (Zn—Sn—O).

A gate insulating layer 140 preferably made of silicon nitride (SiNx) or silicon oxide (SiOx) is formed on the channel layers 151.

A plurality of gate lines 121 including a plurality of gate electrodes 124, and a plurality of storage electrode lines 131 are formed on the gate insulating layer 140.

The gate lines 121 are for transmitting gate signals and extended in the transverse direction, and have a plurality of protruded portions as the gate electrodes 124 extended from the gate lines 121 and overlapping the channel layers 151.

Each of the gate lines 121 has an end portion having a large area for contact with another layer or an external driving circuit. A gate driving circuit (not shown) for generating the gate signals may be integrated with the substrate 110. The gate lines 121 may extend to connect to a driving circuit that may be integrated on the substrate 110.

The storage electrode lines 131 are disposed between two gate lines 121, closer to the downward gate line 121. The storage electrode lines 131 include a plurality of storage electrodes 133 extended close to the gate line 121 in the vertical direction, and are supplied with a predetermined voltage such as a common voltage that is applied to a common electrode (not shown).

The gate lines 121 and storage electrode lines 131 are preferably made of a low resistivity material including an Al containing metal such as Al and Al alloys, a Ag containing metal such as Ag and Ag alloys, a Cu containing metal such as Cu and Cu alloys, a Mo containing metal such as Mo and Mo alloys, Cr, W, Ti, and Ta. The gate lines 121 and the storage electrode lines 131 may have a multi-layered structure including two conductive films (not shown) having different physical characteristics. One of the two films is preferably made of a low resistivity metal including an Al containing metal, a Ag containing metal, and a Cu containing metal for reducing signal delay or voltage drop in the gate lines 121 and the storage electrode lines 131. The other film is preferably made of a material such as Cr, Mo and Mo alloys, Ta, or Ti, which has good physical, chemical, and electrical contact characteristics with other materials such as indium tin oxide (ITO) or indium zinc oxide (IZO). Good examples of the combination of the two films are a lower Cr film and an upper Al alloy film and a lower Al film and an upper Mo film. However, the gate lines 121 and the storage electrode lines 131 may be made of various metals or conductors.

The lateral sides of the gate lines 121 and the storage electrode lines 131 are inclined relative to a surface of the substrate 110, and the inclination angle thereof ranges from about 30 to 80 degrees.

An interlayer insulating layer 160 is formed on the gate lines 121 and storage electrode lines 131. The interlayer insulating layer 160 is preferably made of an inorganic insulator such as silicon nitride or silicon oxide, an organic insulator, and an insulating material having a low dielectric constant. It is preferable that the dielectric constant of the organic insulator and the low dielectric insulating material are less than 4.0. The organic insulator may have photosensitivity and the interlayer insulating layer 160 may have a flat top surface.

The interlayer insulating layer 160 and the gate insulating layer 140 have a plurality of contact holes 163 and 165 exposing portions of the channel layers 151 that are disposed on both sides of gate electrodes 124. Furthermore, the interlayer insulating layer 160 may have a plurality of contact holes (not shown) exposing the end portions of the gate lines 121.

A plurality of data lines 171, a plurality of drain electrodes 175, and a plurality of pixel electrodes 191 are formed on the interlayer insulating layer 160.

The data lines 171 transmit data signals and extend substantially in the longitudinal direction to intersect the gate lines 121. Each of the data lines 171 has a plurality of source electrodes 173 connected to portions of the channel layers 151 through the contact holes 163 and an end portion having a large area for contact with another layer or an external driving circuit. A data driving circuit (not shown) for generating the data signals may be integrated with the substrate 110. The data lines 171 may extend to be connected to a driving circuit that may be integrated with the substrate 110.

The drain electrodes 175 are separated from the source electrodes 173 and connected to portions of the channel layers 151 through the contact holes 165.

The data lines 171 and the source and drain electrodes 173 and 175 include double layers including lower layers 171a, 173a, and 175a, and upper layers 171b, 173b, and 175b, respectively. The lower layers 173a and 175a of the source and drain electrodes 173 and 175 are respectively connected to portions of the channel layers 151 through the contact holes 163 and 165.

The lower layers 173a and 175a of the source and drain electrodes 173 and 175 are preferably made of a transparent conducting oxide (TCO) such as indium (In), zinc (Zn), tin (Sn), aluminum (Al), or gallium (Ga). The work functions of the lower layers 173a and 175a are similar to those of the channel layers 151 such that the contact resistances therebetween are low.

The upper layers 173b and 175b of the source and drain electrodes 173 and 175 are preferably made of a metal such as aluminum (Al), molybdenum (Mo), copper (Cu), silver (Ag), chromium (Cr), tungsten (W), niobium (Nb), titanium (Ti), tantalum (Ta), and alloys thereof, and may have a multi-layered structure.

It is preferable that the upper layer 171b be removed to expose the lower layer 171a in the end portion of the data lines 171. Because the end portions of the data lines 171 must be exposed for contacting with the external circuit, the lower layer 173a having excellent chemical resistance must be exposed.

Like the gate lines 121, the lateral sides of the data lines 171 and the drain electrodes 175 are inclined relative to a surface of the substrate 110, and the inclination angle thereof ranges from about 30 to 80 degrees.

The pixel electrodes 191 are made of the same material as that of the lower layers 173a and 175a of the source and drain electrodes 173 and 175, and extend from the lower layer 175a of the drain electrode 175.

The pixel electrodes 191 receive the data voltage from the drain electrodes 175. The pixel electrodes 191 that are supplied with the data voltages generate electric fields in cooperation with a common electrode (not shown) supplied with a common voltage, which determines the orientations of liquid crystal molecules of a liquid crystal layer (not shown) disposed between the two electrodes, or generate a current in a light emitting layer (not shown) disposed between the two electrodes to emit the light.

A passivation layer 180 is formed on the data lines 171, the drain electrodes 175, and the interlayer insulating layer 160. The passivation layer 180 is preferably made of an inorganic insulating material such as silicon nitride and silicon oxide, or an organic insulating material. Furthermore, the passivation layer 180 may include a lower layer of an inorganic insulating material and an upper layer of an organic material.

The passivation layer 180 includes portions extended according to the data lines 171 to cover the data lines 171, and portions protruded in the horizontal direction to cover the source electrodes 173 and the drain electrodes 175. Accordingly, most of the pixel electrodes 191 are exposed from the passivation layer 180.

A spacer (column spacer) 320 for maintaining a cell gap between the thin film transistor array panel and a common electrode panel facing the thin film transistor array panel is formed on the passivation layer 180. The spacer 320 substantially has the same planar shape as that of the passivation layer 180. As in the following description, the passivation layer 180 is etched by using the spacer 320 as an etching mask.

Now, a method of manufacturing the LCD shown in FIGS. 1 and 2 according to an embodiment of the present invention will be described in detail with reference to FIGS. 3 to 10 as well as FIGS. 1 and 2.

Figure 3:
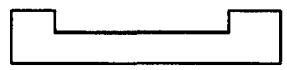
FIG. 3, FIG. 5, and FIG. 9 are layout views of a thin film transistor array panel during intermediate steps of a manufacturing method thereof according to a first exemplary embodiment of the present invention.
Figure 3:
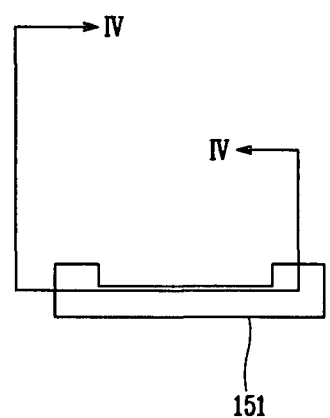
Figure 4:
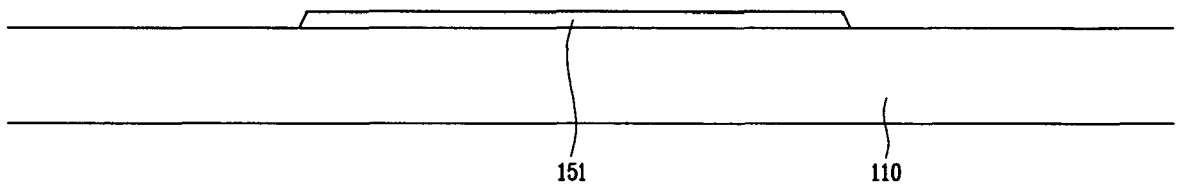
FIG. 4 is a cross-sectional view of the thin film transistor array panel shown in FIG. 3 taken along the line IV-IV.
Figure 5:
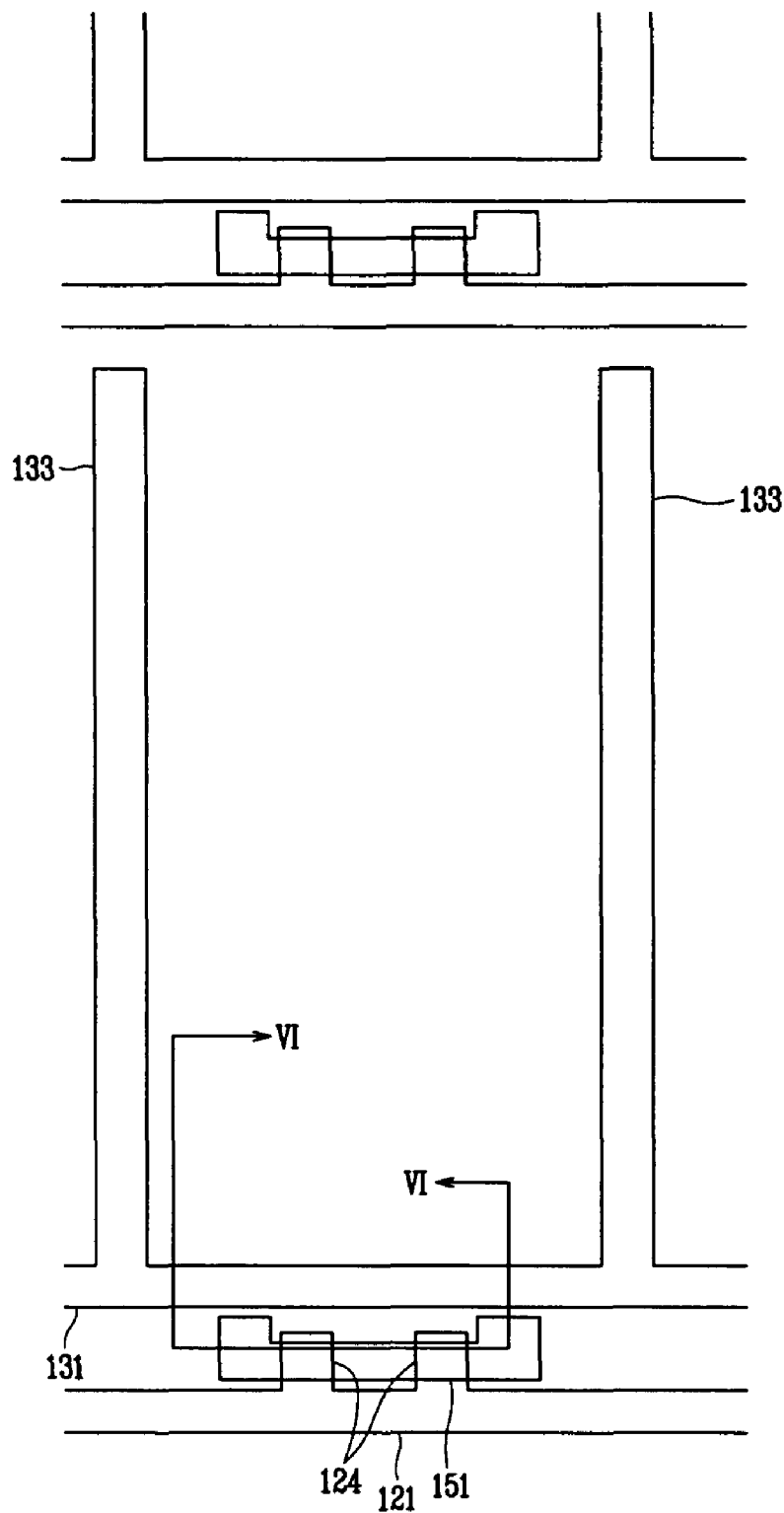
Figure 6:
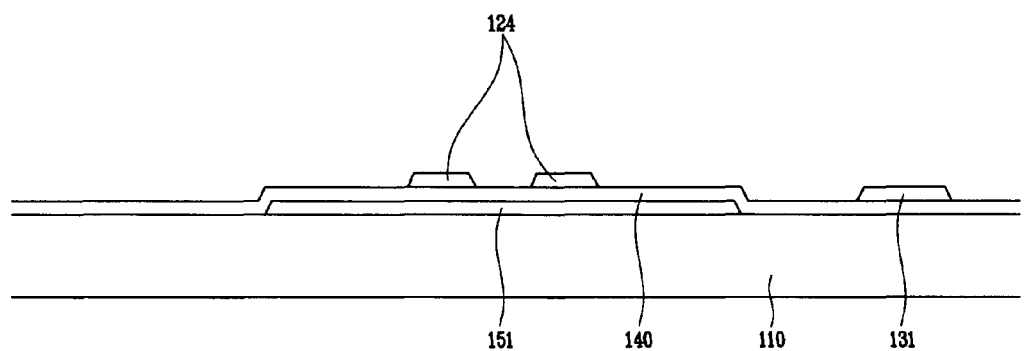
FIG. 6 is a cross-sectional view of the thin film transistor array panel shown in FIG. 5 taken along the line VI-VI.
Figure 7:
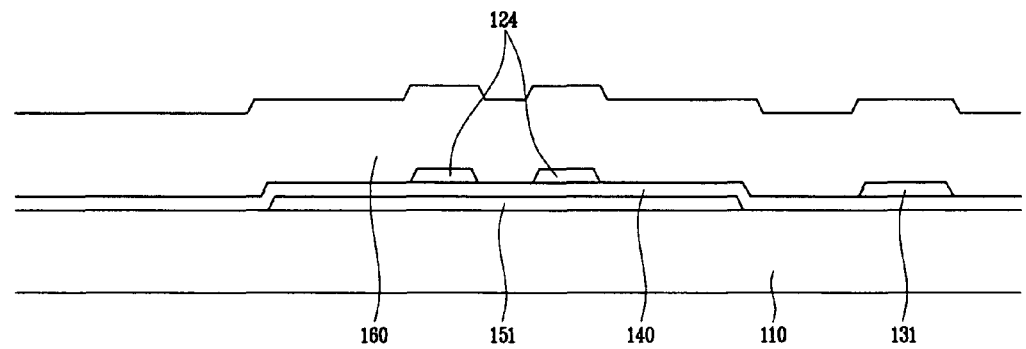
FIG. 7 and FIG. 8 are cross-sectional views of the thin film transistor array panel in the following steps of FIG. 6.
Figure 8:
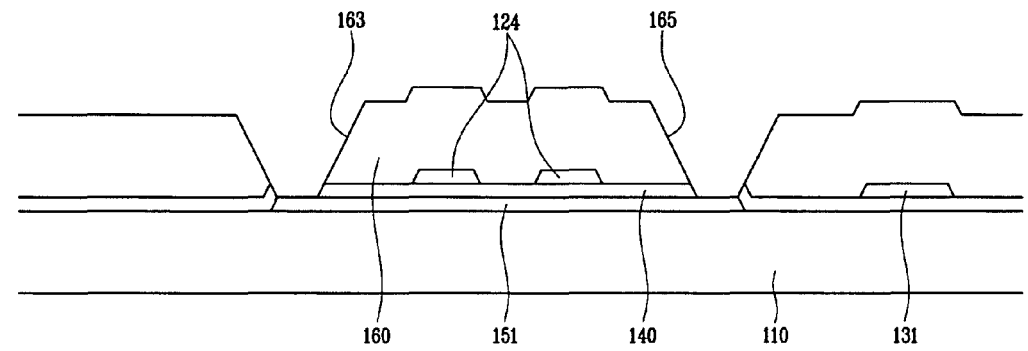
Figure 9:
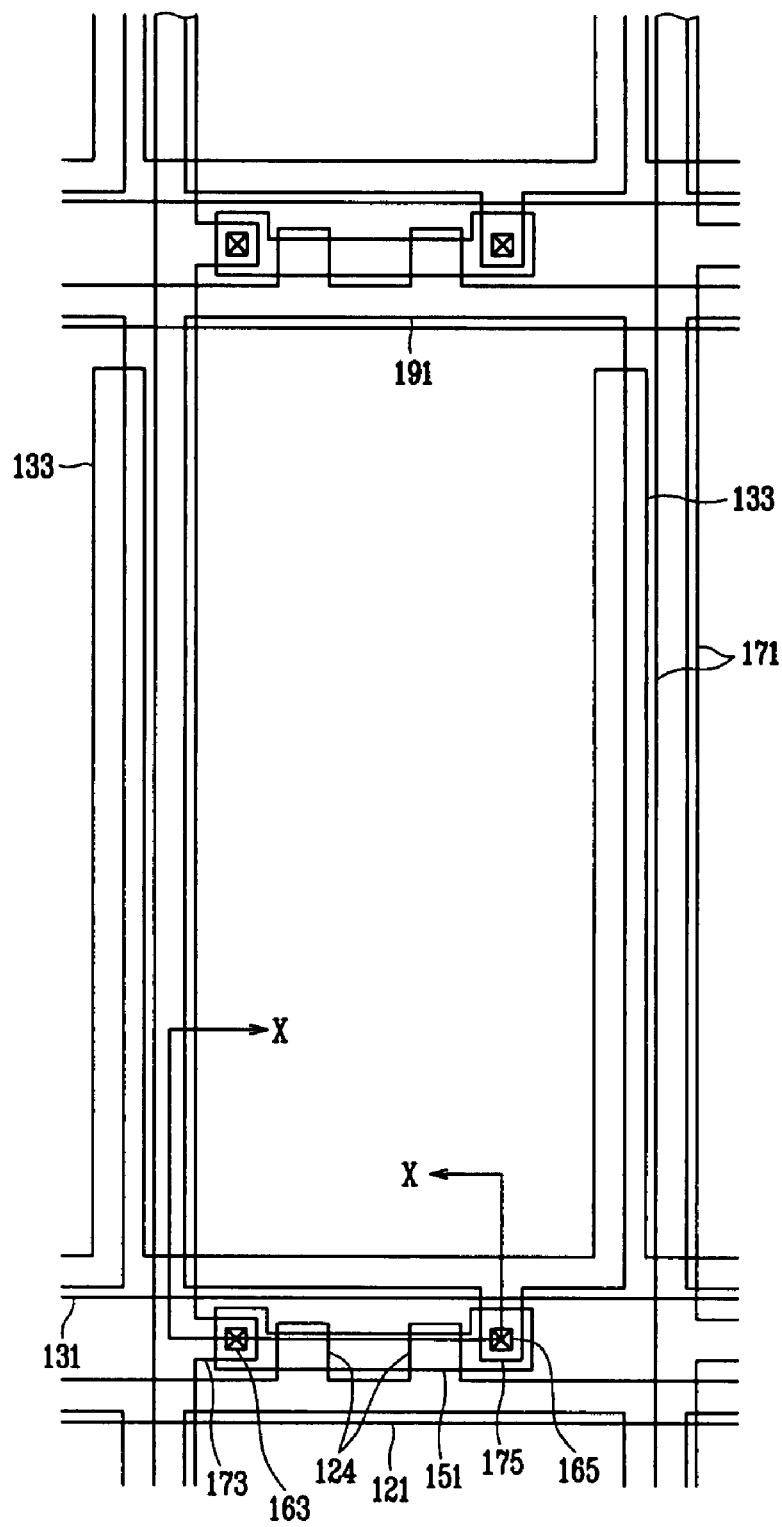
Figure 10:
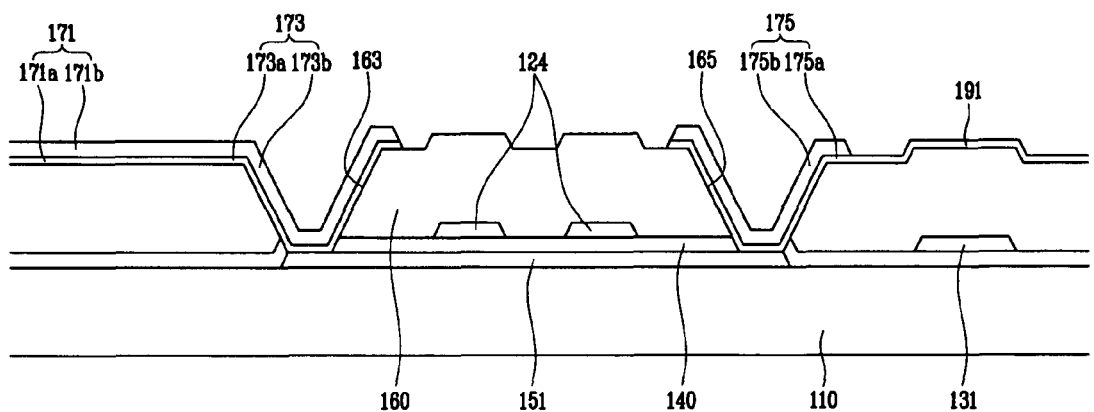
FIG. 10 is a cross-sectional view of the thin film transistor array panel shown in FIG. 9 taken along the line X-X.

FIG. 3, FIG. 5, and FIG. 9 are layout views of a thin film transistor array panel during intermediate steps of a manufacturing method thereof according to a first exemplary embodiment of the present invention, and FIG. 4 is a cross-sectional view of the thin film transistor array panel shown in FIG. 3 taken along the line IV-IV. FIG. 6 is a cross-sectional view of the thin film transistor array panel shown in FIG. 5 taken along the line VI-VI, FIG. 7 and FIG. 8 are cross-sectional views of the thin film transistor array panel in the following steps of FIG. 6, and FIG. 10 is a cross-sectional view of the thin film transistor array panel shown in FIG. 9 taken along the line X-X.

Firstly, referring to FIGS. 3 and 4, an oxide semiconductor layer is formed on a transparent insulating substrate 110 by using chemical vapor deposition, sputtering, etc. The oxide semiconductor layer is preferably made of an oxide semiconductor material including an oxide substance such as zinc (Zn), gallium (Ga), tin (Sn), or indium (In), and an oxide compound oxide substance such as zinc oxide (ZnO), indium-gallium-zinc oxide (InGaZnO$_4$), indium-zinc oxide (Zn—In—O), or zinc-tin oxide (Zn—Sn—O).

Then, the oxide semiconductor layer is patterned by lithography to form a plurality of channel layers 151.

On the other hand, when forming a blocking film, silicon oxide or silicon nitride is deposited on the substrate 110 before forming the oxide semiconductor layer.

Next, as shown in FIGS. 5 and 6, a gate insulating layer 140 is deposited on the channel layers 151 by using chemical vapor deposition, etc., and then, a metal layer is formed thereon. Then, the metal layer is patterned by photolithography to form a plurality of gate lines 121 including gate electrodes 124, and a plurality of storage electrode lines 131 including storage electrodes 133.

Next, referring to FIGS. 7 and 8, an interlayer insulating layer 160 is formed on the whole surface of the substrate 110, and the interlayer insulating layer 160 and the gate insulating layer 140 are patterned by photolithography to form a plurality of contact holes 163 and 165 exposing portions of the channel layers 151. Also, a plurality of contact holes exposing end portions of the gate lines 121 may be formed.

Next, the impurities on the exposed surfaces through the contact holes 163 and 165 and the surface of the interlayer insulating layer 160 are removed by using a plasma treatment.

Next, referring to FIGS. 9 and 10, a lower metal layer and an upper metal layer are sequentially formed on the interlayer insulating layer 160 by using sputtering, and are patterned by photolithography to form a plurality of data lines 171 including source electrodes 173 with a lower layer 173a and an upper layer 173b, and a plurality of drain electrodes 175 with a lower layer 175a and an upper layer 175b. At this time, a plurality of pixel electrodes 191 that are extended from the drain electrodes 175 are simultaneously formed.

The data lines 171, the drain electrodes 175, and the pixel electrodes 191 are formed by the following steps.

Firstly, the lower metal layer and the upper metal layer are sequentially deposited, and then a photosensitive film pattern having different thicknesses according to position is formed. The photosensitive film pattern may be formed by exposing and developing a photosensitive film using a half-tone mask including a light transmittance region, a light translucent region, and a light blocking region. The light translucent region of the half-tone mask may include an intermediate transmittance layer or slit patterns. The thickness of the portion of the photosensitive film pattern corresponding to the pixel electrodes 191 is thinner than the portion corresponding to the data lines 171 and the drain electrodes 175.

The upper metal layer is firstly etched by using the photosensitive film pattern as an etching mask, and then the lower metal layer is secondly etched. Next, the ashing process is executed to remove the portion of the photosensitive film corresponding to the pixel electrodes 191, and the upper metal layer is thirdly etched by using the remaining photosensitive film corresponding to the data lines 171 and the drain electrodes 175 as an etching mask. Accordingly, the upper metal layer corresponding to the pixel electrodes 191 is removed by the third etching.

The source electrodes 173, the drain electrodes 175, and the pixel electrodes 191 may be simultaneously patterned through this three-step etching process.

Also, to reduce the three-step etching process into a two-step etching process, the first etching process and the second etching process may be executed together.

Finally, as shown in FIGS. 1 and 2, the insulating layer is deposited, and a spacer 320 is formed thereon. Next, the insulating layer is etched by using the spacer 320 as an etching mask to expose the pixel electrodes 191 and to form a passivation layer 180 covering the data lines 171, the source electrodes 173, and the drain electrodes 175. Here, the spacer 320 is preferably made of a photosensitive material, and the spacer 320 may be formed by using only a photo process in this case.

Exemplary Embodiment 2

Figure 11:
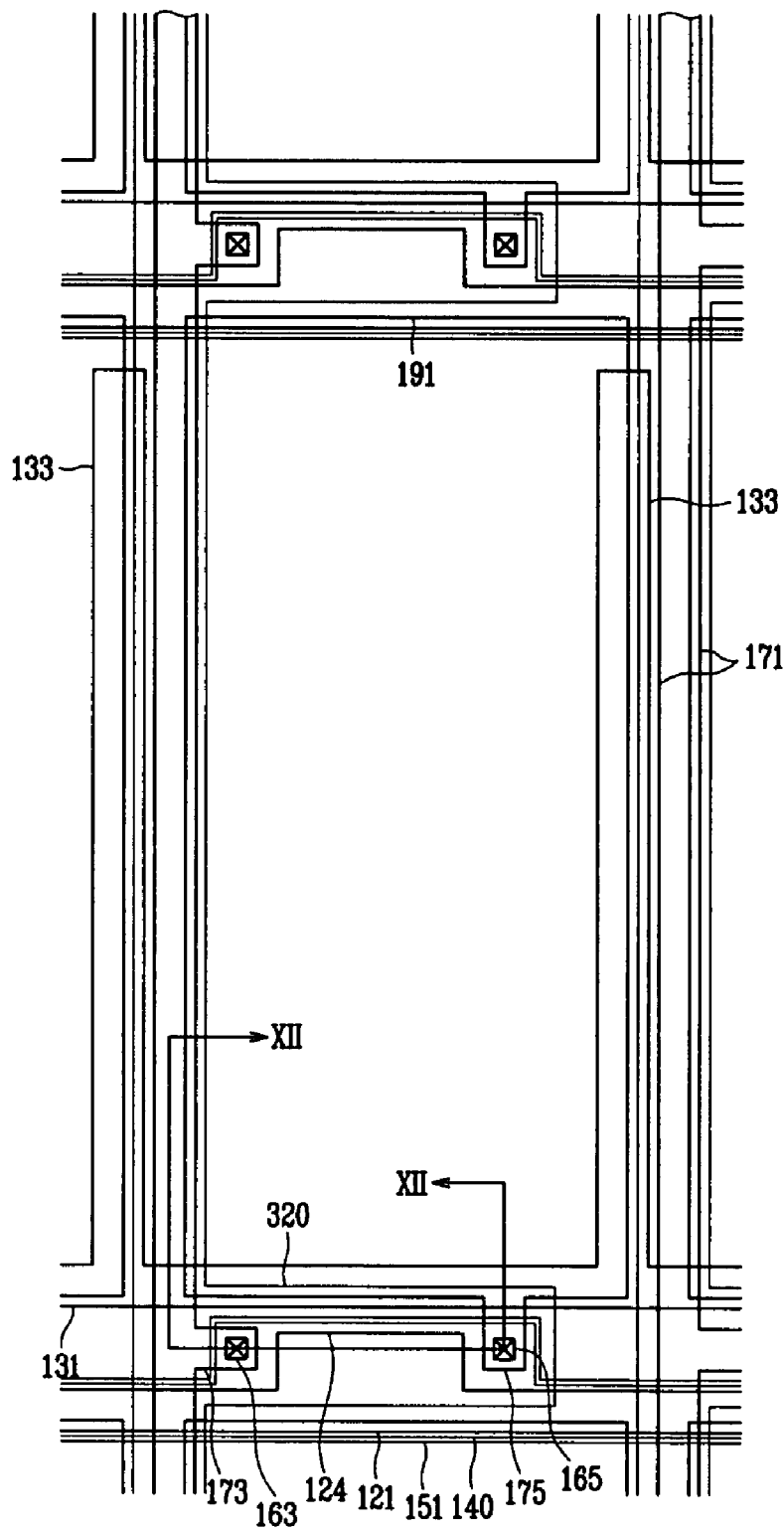
FIG. 11 is a layout view of a thin film transistor array panel according to a second exemplary embodiment of the present invention.
Figure 12:
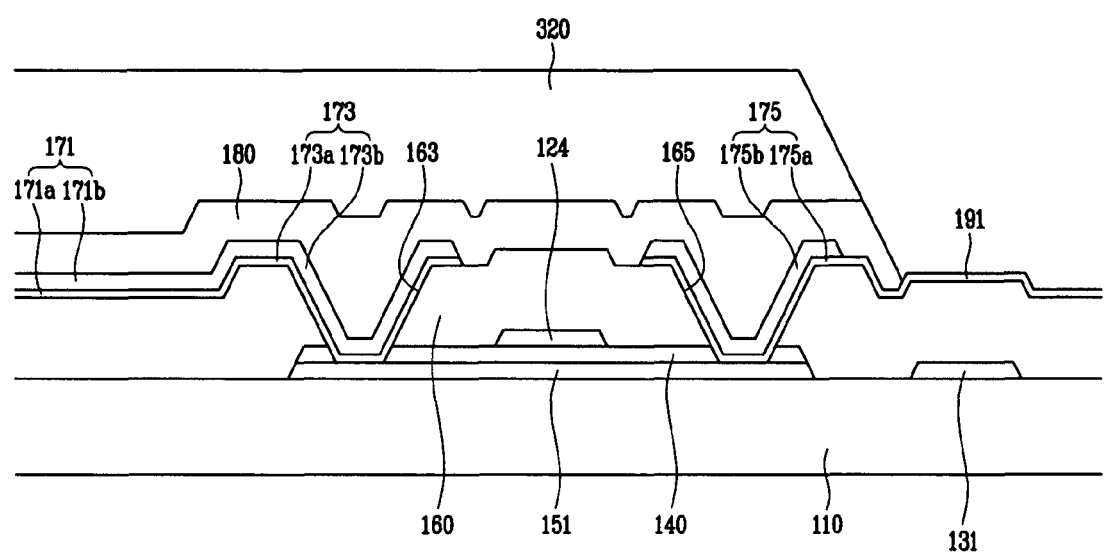
FIG. 12 is a cross-sectional view of the thin film transistor array panel shown in FIG. 11 taken along the line XII-XII.

FIG. 11 is a layout view of a thin film transistor array panel according to a second exemplary embodiment of the present invention, and FIG. 12 is a cross-sectional view of the thin film transistor array panel shown in FIG. 11 taken along the line XII-XII.

A plurality of channel layers 151 are formed on an insulating substrate 110 made of a material such as transparent glass or plastic. The channel layers 151 are extended in the transverse direction, and they have protruded portions for contacting with another layer.

A blocking film (not shown) preferably made of silicon oxide ($SiO_2$) may be formed between the channel layers 151 and the substrate 110 for preventing the impurities of the substrate 110 from diffusing and penetrating into the channel layers 151.

A plurality of gate insulating layers 140 are formed on the channel layers 151. Like the channel layers 151, the gate insulating layers 140 are extended in the transverse direction, and they have protruded portions having a wide area. Here, the gate insulating layers 140 have substantially the same planar shapes as the channel layers 151. The reason for this is that the gate insulating layers 140 and the channel layers 151 are simultaneously patterned by photolithography, as in the following description.

A plurality of gate lines 121 including gate electrodes 124 are formed on the gate insulating layers 140. The gate lines 121 transmit gate signals, and are extended in the transverse direction. The gate electrodes 124 are protruded from the gate lines 121. Most of the gate lines 121 are disposed on the gate insulating layers 140.

A plurality of storage electrode lines 131 are formed on the substrate 110 between two gate lines 121, and are disposed closer to the lower of the two gate lines 121. The storage electrode lines 131 include a plurality of storage electrodes 133 extended closer to the upper of the two gate lines 121 in the vertical direction.

The storage electrode lines 131 may be disposed between the channel layers 151 and the gate insulating layers 140.

Because the rest of the structure of the thin film transistor array panel according to this embodiment is the same as that of the first exemplary embodiment, description thereof is omitted.

Now, a method of manufacturing the thin film transistor array panel shown in FIGS. 11 and 12 according to a second embodiment of the present invention will be described in detail with reference to FIGS. 13 to 20, as well as FIGS. 11 and 12.

Figure 13:
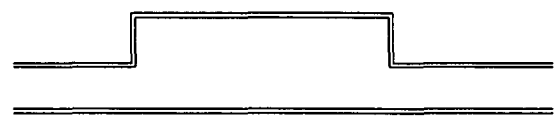
FIG. 13, FIG. 15, and FIG. 19 are layout views of a thin film transistor array panel during intermediate steps of a manufacturing method thereof according to a first exemplary embodiment of the present invention.
Figure 13:
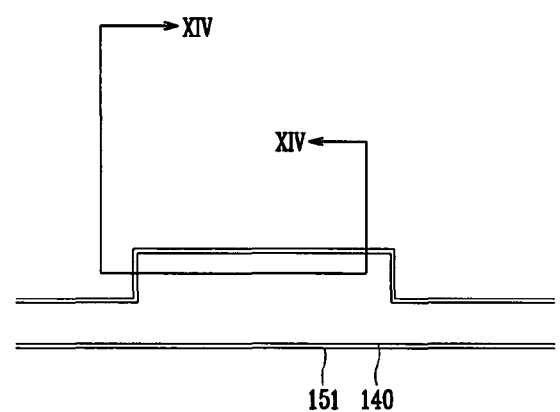
Figure 14:
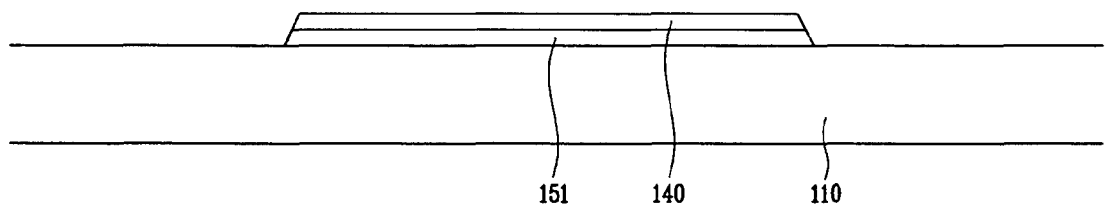
FIG. 14 is a cross-sectional view of the thin film transistor array panel shown in FIG. 13 taken along the line XIV-XIV.
Figure 15:
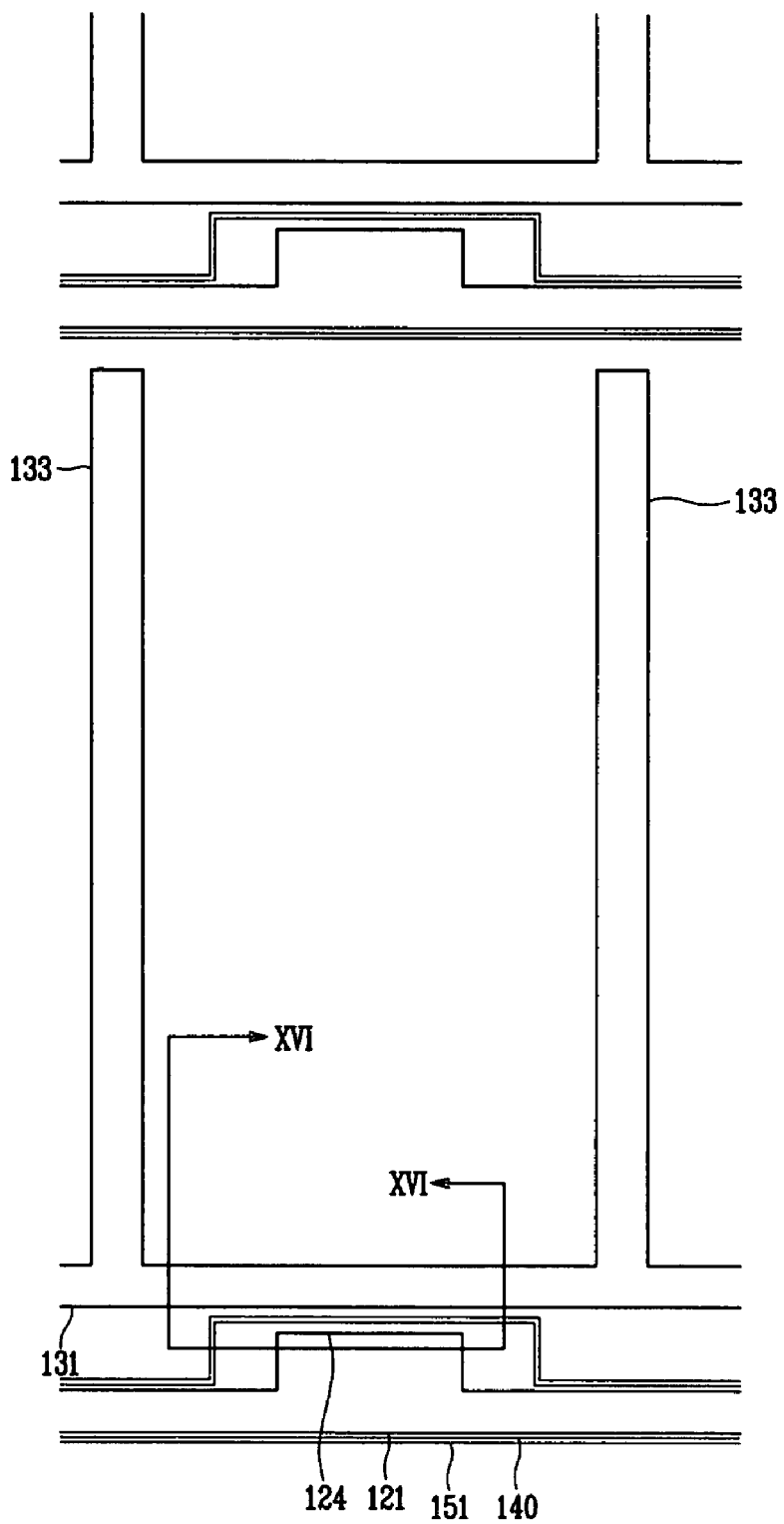
Figure 16:
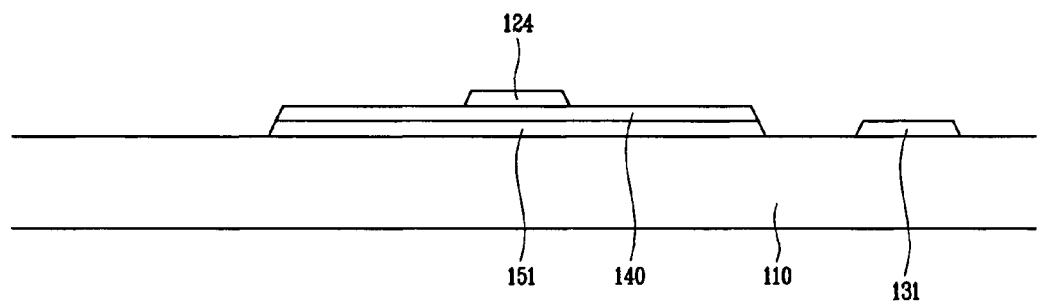
FIG. 16 is a cross-sectional view of the thin film transistor array panel shown in FIG. 15 taken along the line XIV-XVI.
Figure 17:
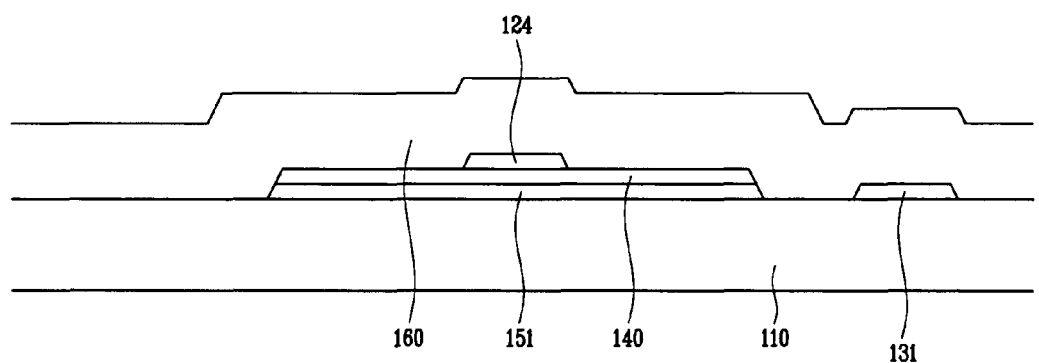
FIG. 17 and FIG. 18 are cross-sectional views of the thin film transistor array panel in the following steps of FIG. 16.
Figure 18:
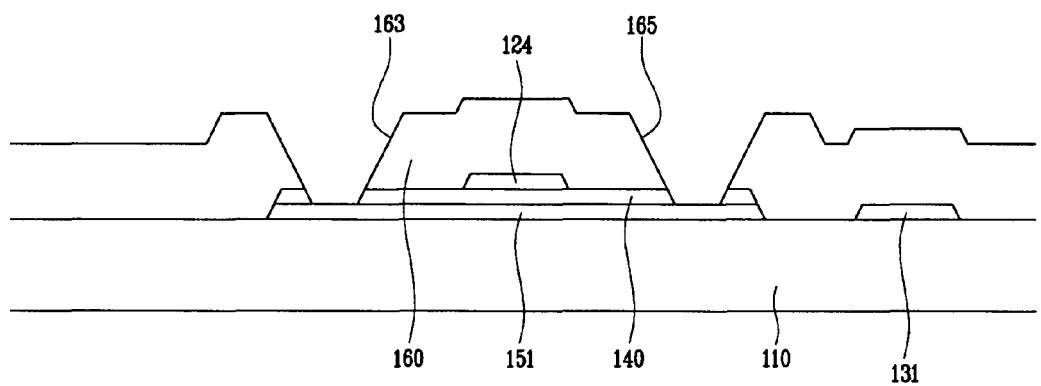
Figure 19:
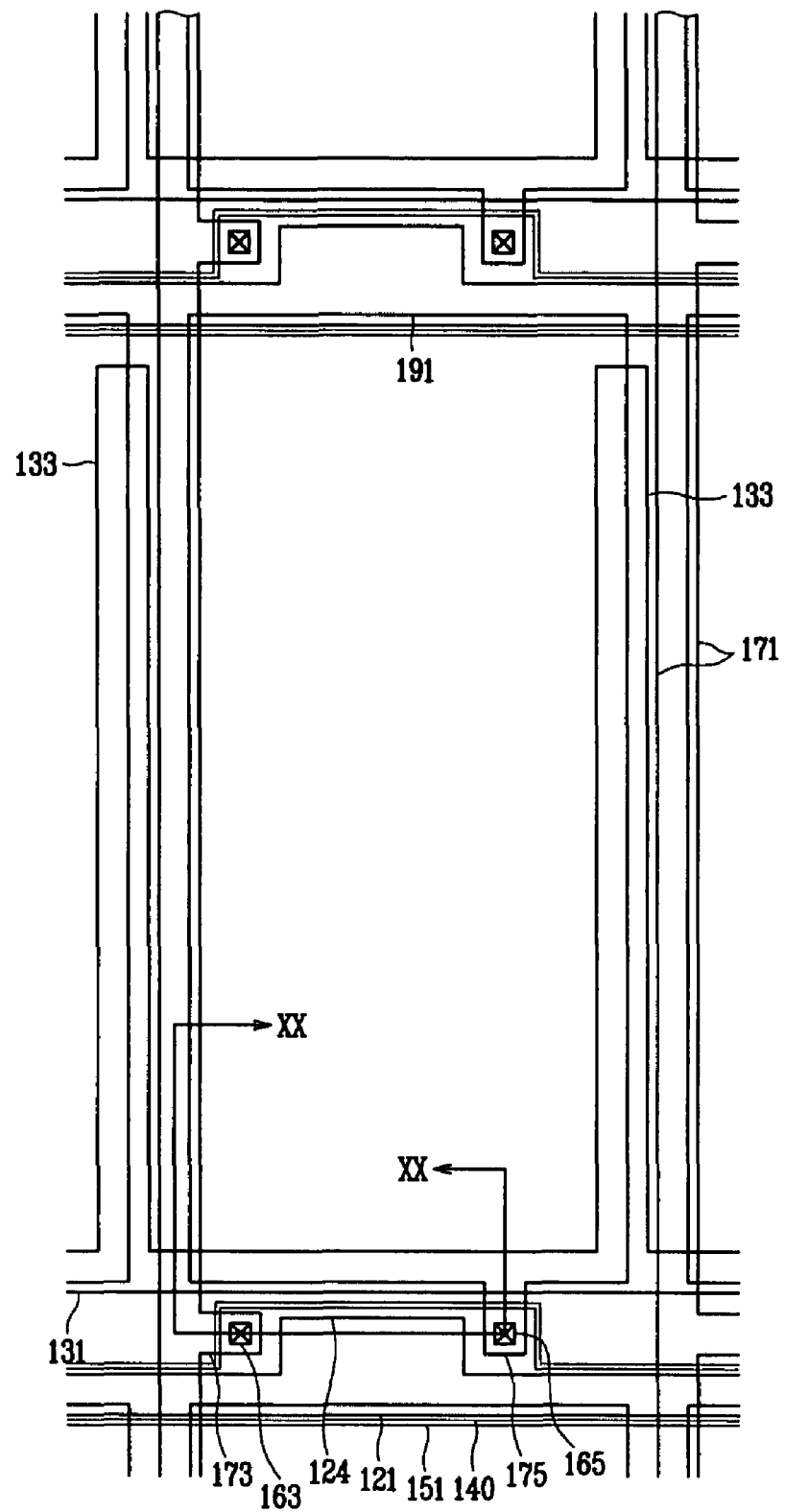
Figure 20:
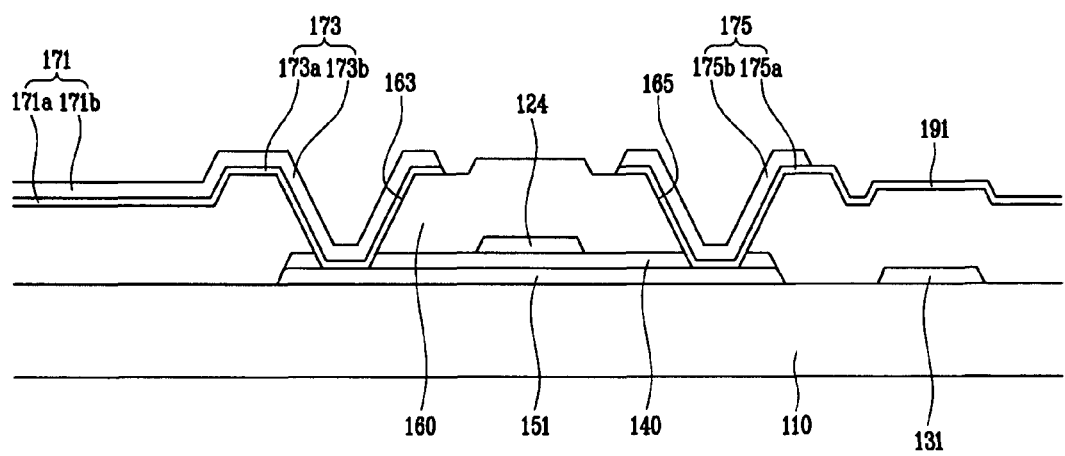
FIG. 20 is a cross-sectional view of the thin film transistor array panel shown in FIG. 19 taken along the line XX-XX.

FIG. 13, FIG. 15, and FIG. 19 are layout views of a thin film transistor array panel during intermediate steps of a manufacturing method thereof according to a second exemplary embodiment of the present invention, FIG. 14 is a cross-sectional view of the thin film transistor array panel shown in FIG. 13 taken along the line XIV-XIV. FIG. 16 is a cross-sectional view of the thin film transistor array panel shown in FIG. 15 taken along the line XIV-XVI, FIG. 17 and FIG. 18 are cross-sectional views of the thin film transistor array panel in the following steps of FIG. 16, and FIG. 20 is a cross-sectional view of the thin film transistor array panel shown in FIG. 19 taken along the line XX-XX.

As shown in FIGS. 13 and 14, an oxide semiconductor layer and a gate insulating layer are sequentially deposited on the transparent substrate 110 without a vacuum break by using sputtering, and are patterned once by photolithography to form a plurality of gate insulating layers 140 and channel layers 151.

The reason for depositing the oxide semiconductor layer and the gate insulating layer without a vacuum break in one chamber is to prevent them from being exposed to the outside environment. Otherwise, when the oxide semiconductor layer and the gate insulating layer are deposited, the channel portions of the channel layers 151 are exposed to an etching gas, oxygen, or moisture, such that the channel portions are damaged. Accordingly, the threshold voltage Vth of the channel layers 151 may be shifted with a negative value.

Next, as shown in FIGS. 15 and 16, a metal layer is formed on the whole surface of the substrate 110. Then, the metal layer is patterned by photolithography to form a plurality of gate lines 121 including gate electrodes 124, and a plurality of storage electrode lines 131 including storage electrodes 133.

The following processes of the method for manufacturing the thin film transistor array panel according to this embodiment are the same as the manufacturing processes described with the reference to FIGS. 7 to 10.

That is to say, as shown in FIG. 17, an interlayer insulating layer 160 is formed on the whole surface of the substrate 110.

Next, as shown in FIG. 18, the interlayer insulating layer 160 and the gate insulating layers 140 are patterned by photolithography to form a plurality of contact holes 163 and 165 exposing portions of the channel layers 151, and the impurities on the exposed surfaces through the contact holes 163 and 165 and the surface of the interlayer insulating layer 160 are removed by using a plasma treatment.

Next, referring to FIGS. 19 and 20, a lower metal layer and an upper metal layer are sequentially formed on the interlayer insulating layer 160 by using sputtering, and are patterned by photolithography using a half tone mask to form a plurality of data lines 171 including source electrodes 173 with a lower layer 173a and an upper layer 173b, a plurality of drain electrodes 175 with a lower layer 175a and an upper layer 175b, and a plurality of pixel electrodes 191 extended from the lower layers 175a of the drain electrodes 175.

Finally, as shown in FIG. 11 and FIG. 12, the insulating layer is deposited and a spacer 320 is formed thereon. Next, the insulating layer is etched by using the spacer 320 as an etching mask to form a passivation layer 180 exposing the pixel electrodes 191.

Exemplary Embodiment 3

Figure 21:
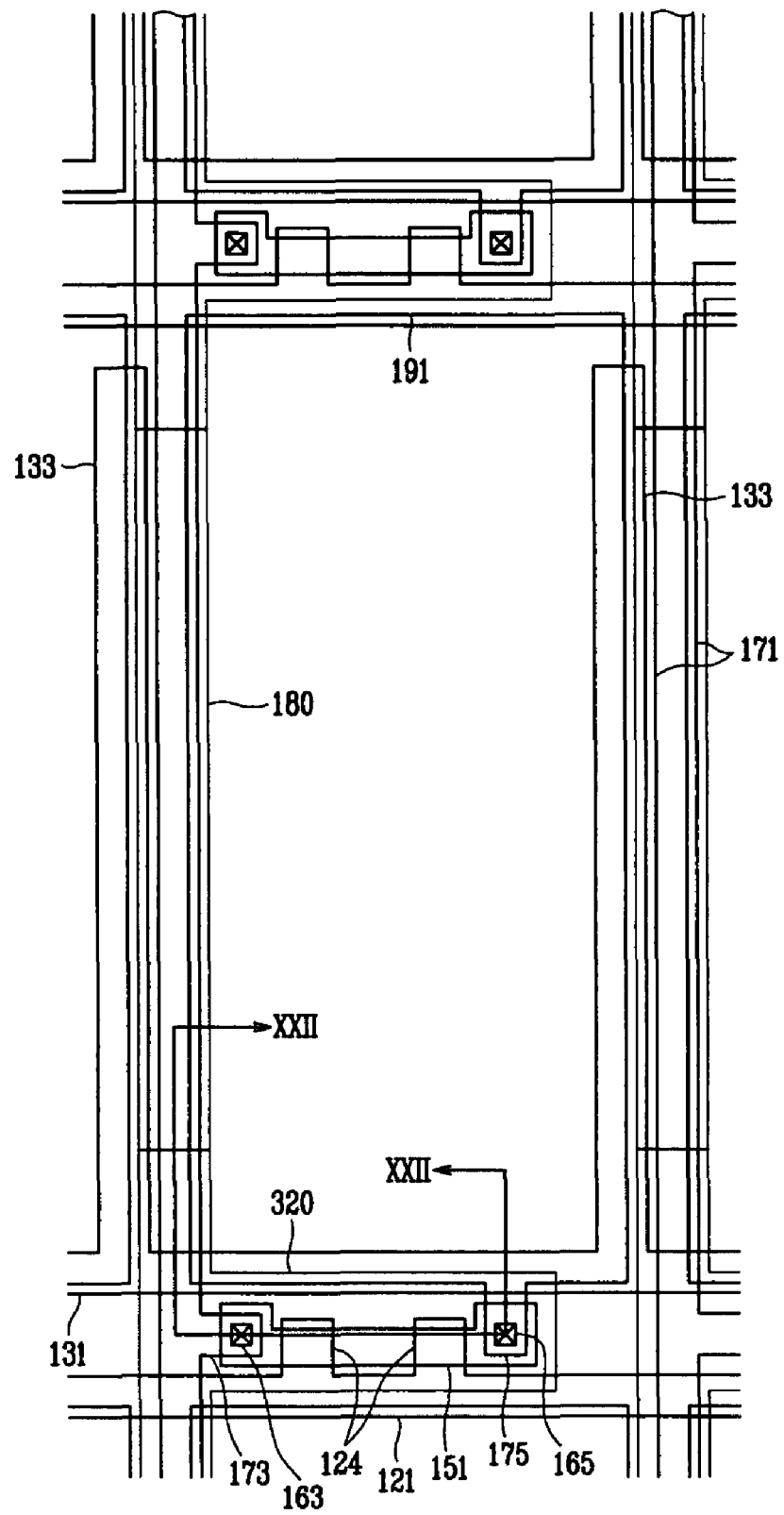
FIG. 21 is a layout view of a thin film transistor array panel according to a third exemplary embodiment of the present invention.
Figure 22:
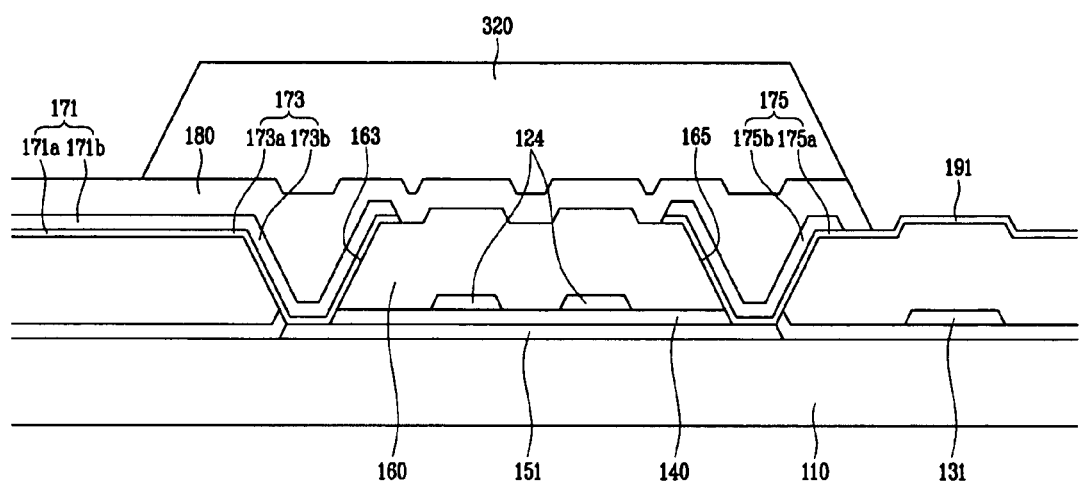
FIG. 22 is a cross-sectional view of the thin film transistor array panel shown in FIG. 21 taken along the line XXI-XXI.

FIG. 21 is a layout view of a thin film transistor array panel according to a third exemplary embodiment of the present invention, and FIG. 22 is a cross-sectional view of the thin film transistor array panel shown in FIG. 21 taken along the line XXI-XXI.

In a thin film transistor array panel according to the third exemplary embodiment of the present invention, the portions of the spacers 320 overlapping the data lines 171 are partially removed and the passivation layer 180 thereunder is exposed, different from the first exemplary embodiment. Rather than removing them, the portions of the spacers 320 overlapping the data lines 171 may have a thinner thickness than the other portions.

Therefore, in this embodiment, the spacers 320 have island shapes with a partially removed area, and so the liquid crystal material may be easily injected between the two panels in the injection process of the liquid crystal material.

A manufacturing method of the thin film transistor array panel according to this embodiment includes the same process as that of the first exemplary embodiment of the present invention up to forming the data lines 171, the drain electrodes 175, and the pixel electrodes 191.

Next, an insulating layer is deposited on the data lines 171, the drain electrodes 175, and the pixel electrodes 191, and a photosensitive film is formed on the insulating layer. Next, the photosensitive film is exposed and developed using a half tone mask. Therefore, the photosensitive film has temporary spacers having a thinner thickness than other portions and disposed on the data lines. The insulating layer is etched using the temporary spacers as an etching mask to expose the pixel electrodes 191. When forming the passivation layer 180, portions of the temporary spacers are etched such that their thickness is reduced, such that the spacer 320 is completed. At this time, the temporary spacers disposed on the data lines 171 and having the thin thickness may be completely removed, or be remained with a thinner thickness by controlling the etching time. As occasion demands, an ashing process may be executed to control the thickness of the spacer 320.

Exemplary Embodiment 4

Figure 23:
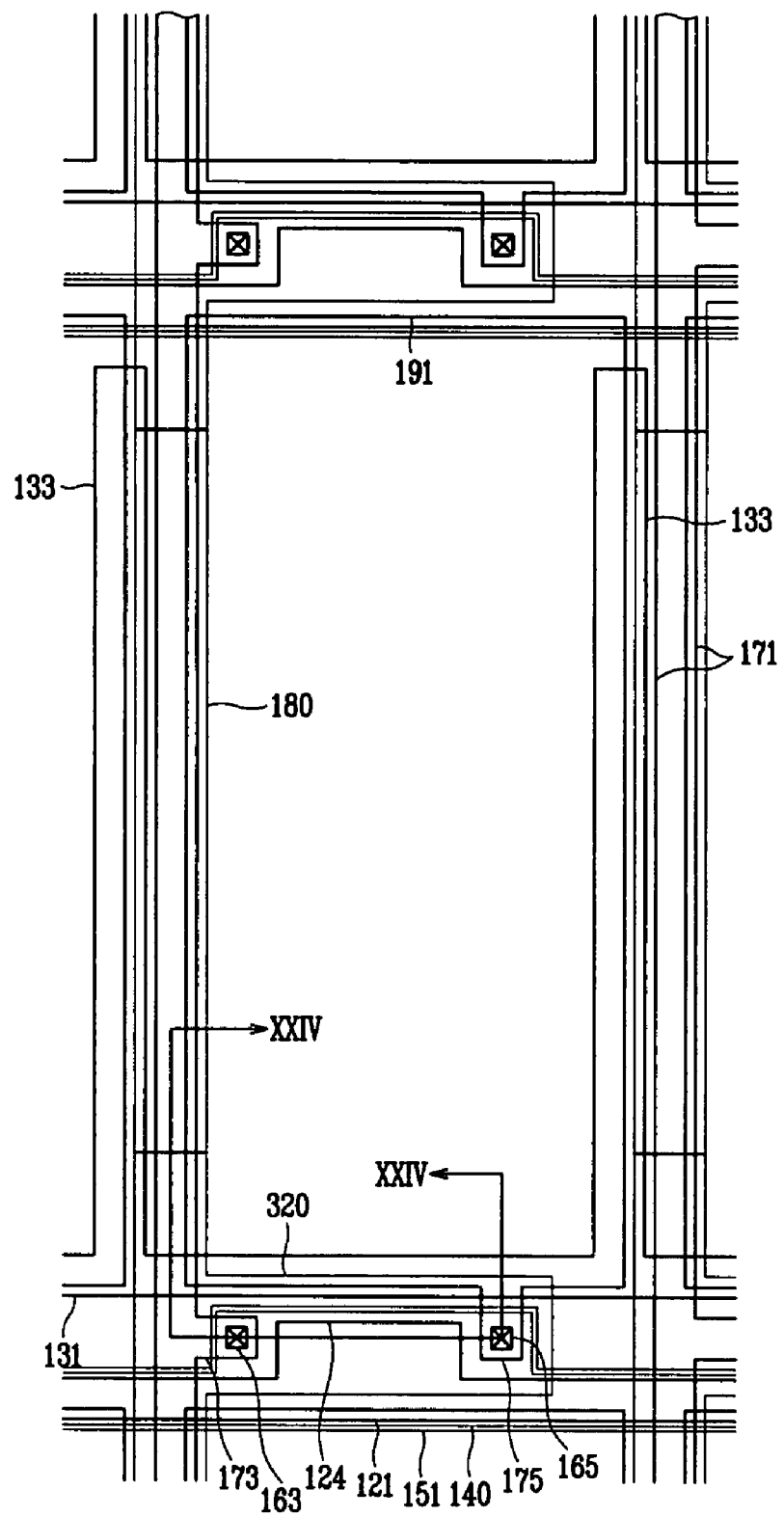
FIG. 23 is a layout view of a thin film transistor array panel according to a fourth exemplary embodiment of the present invention.
Figure 24:
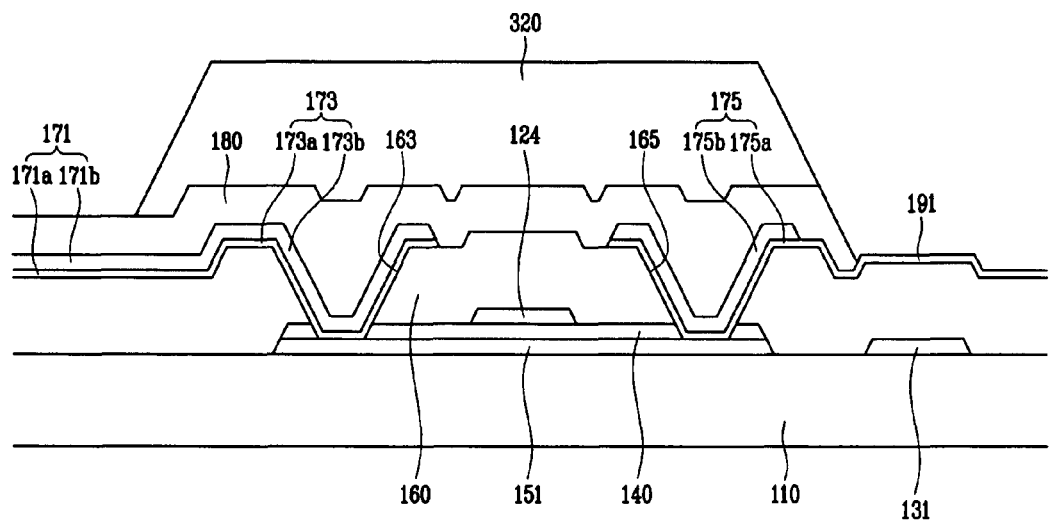
FIG. 24 is a cross-sectional view of the thin film transistor array panel shown in FIG. 23 taken along the line XXIV-XXIV.

FIG. 23 is a layout view of a thin film transistor array panel according to a fourth exemplary embodiment of the present invention, and FIG. 24 is a cross-sectional view of the thin film transistor array panel shown in FIG. 23 taken along the line XXIV-XXIV.

In a thin film transistor array panel according to the fourth exemplary embodiment of the present invention, portions of the spacers 320 overlapping the data lines 171 are partially removed and the passivation layer 180 thereunder is exposed, different from the first exemplary embodiment. Rather than removing them, the portions of the spacers 320 overlapping the data lines 171 may have a thinner thickness than the other portions.

Therefore, in this embodiment, the spacers 320 have island shapes with a partially removed area, and so the liquid crystal material may be easily injected between the two panels in the injection process of the liquid crystal material.

A manufacturing method of the thin film transistor array panel according to this embodiment includes the same process as that of the second exemplary embodiment of the present invention up to forming the data lines 171, the drain electrodes 175, and the pixel electrodes 191.

Next, an insulating layer is deposited on the data lines 171, the drain electrodes 175, and the pixel electrodes 191, and a photosensitive film is formed on the insulating layer. Next, the photosensitive film is exposed and developed using a half tone mask. Therefore, the photosensitive film has temporary spacers having a thinner thickness than the other portions and disposed on the data lines 171. The insulating layer is etched using the temporary spacers as an etching mask to expose the pixel electrodes 191. When forming the passivation layer 180, portions of the temporary spacers are etched such that their thickness is reduced, such that the spacer 320 is completed. At this time, the temporary spacers disposed on the data lines 171 and having the thin thickness may be completely removed, or be remained with a thinner thickness by controlling the etching time. As occasion demands, an ashing process may be executed to control the thickness of the spacer 320.

Exemplary Embodiment 5

Figure 25:
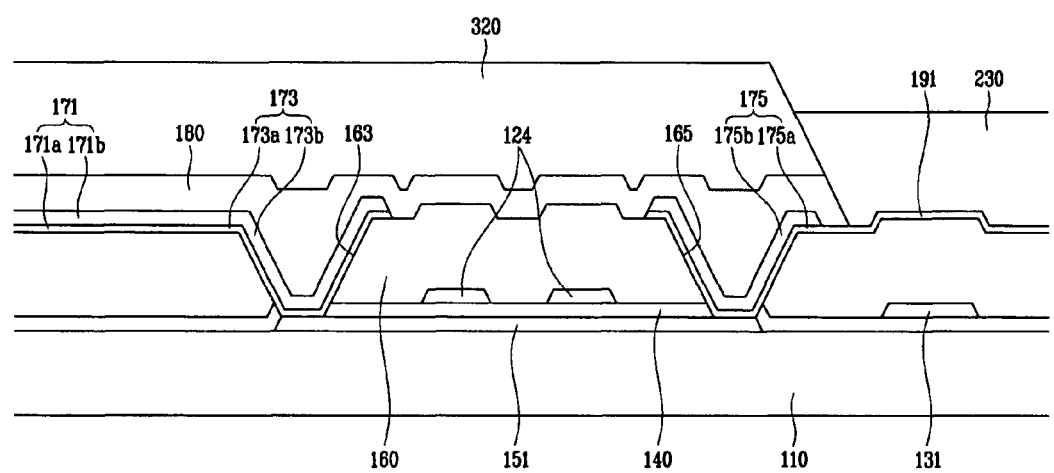
FIG. 25 is a cross-sectional view of a thin film transistor array panel according to a fifth exemplary embodiment of the present invention.

FIG. 25 is a cross-sectional view of a thin film transistor array panel according to a fifth exemplary embodiment of the present invention.

In a thin film transistor array panel according to the fifth exemplary embodiment of the present invention, a plurality of color filters 230, only one of which is shown in FIG. 25, are formed on the pixel electrodes 191, different from the first exemplary embodiment.

The color filters 230 are formed on the pixel electrodes 191 such that misalignment between the pixel electrodes 191 and the color filters 230 may be minimized when combining the thin film transistor array panel and the corresponding panel.

The method for manufacturing the thin film transistor array panel according to the fifth exemplary embodiment of the present invention is the same as that of the first exemplary embodiment, and the process for forming the color filters 230 is added after forming the spacer 320 and the passivation layer 180.

The thin film transistor array panel according to the third exemplary embodiment of the present invention may also include a plurality of color filters on the pixel electrodes 191.

Exemplary Embodiment 6

Figure 26:
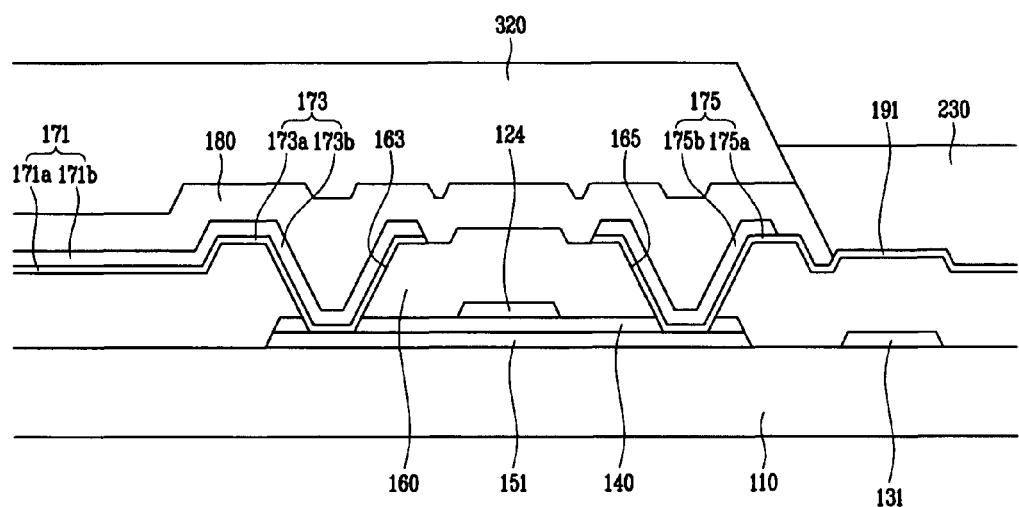
FIG. 26 is a cross-sectional view of a thin film transistor array panel according to a sixth exemplary embodiment of the present invention.

FIG. 26 is a cross-sectional view of a thin film transistor array panel according to the sixth exemplary embodiment of the present invention.

The thin film transistor array panel according to the sixth exemplary embodiment of the present invention includes a plurality of color filters 230, only one of which is shown in FIG. 26, formed on the pixel electrodes 191, different from the second exemplary embodiment.

Color filters 230 are formed on the pixel electrodes 191 such that misalignment between the pixel electrodes 191 and the color filters 230 may be minimized when combining the thin film transistor array panel and the corresponding panel.

The method for manufacturing the thin film transistor array panel according to the sixth exemplary embodiment of the present invention is the same as that of the second exemplary embodiment, and the process for forming the color filters 230 is added after forming the spacer 320 and the passivation layer 180.

The thin film transistor array panel according to the fourth exemplary embodiment of the present invention may also include a plurality of color filters formed on the pixel electrodes 191.

Exemplary Embodiment 7

Figure 27:
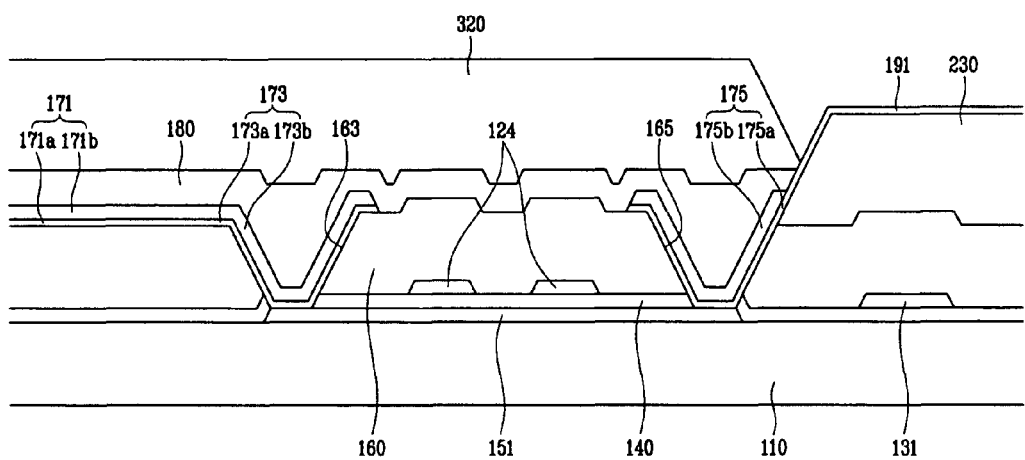
FIG. 27 is a layout view of a thin film transistor array panel according to a seventh exemplary embodiment of the present invention.

FIG. 27 is a cross-sectional view of a thin film transistor array panel according to the seventh exemplary embodiment of the present invention.

The thin film transistor array panel according to the seventh exemplary embodiment of the present invention includes a plurality of color filters 230 formed between the pixel electrodes 191 and the interlayer insulating layer 160, different from the fifth exemplary embodiment where color filter 230 is above pixel electrode 191.

Color filters 230 are formed between the pixel electrodes 191 and the insulating layer 160 such that misalignment between the pixel electrodes 191 and the color filters 230 may be minimized when combining the thin film transistor array panel and the corresponding panel. Furthermore, because the pixel electrodes 191 cover the color filters 230, the pixel electrodes 191 prevent the color filters 230 from contacting with the liquid crystal material, thereby preventing contamination of the liquid crystal material.

The thin film transistor array panel according to the seventh exemplary embodiment of the present invention may be manufactured by adding a step of forming the color filters 230 after forming the interlayer insulating layer 160, in addition to the method for manufacturing the thin film transistor array panel according to the first exemplary embodiment The thin film transistor array panel according to the third exemplary embodiment of the present invention may also include a plurality of color filters 230 between the pixel electrodes 191 and the interlayer insulating layer 160.

Exemplary Embodiment 8

Figure 28:
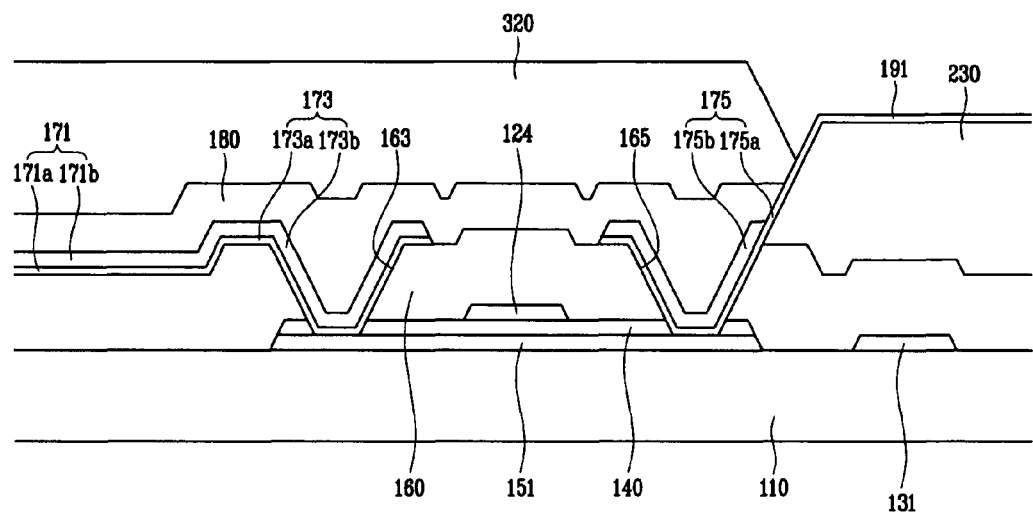
FIG. 28 is a cross-sectional view of a thin film transistor array panel according to an eighth exemplary embodiment of the present invention.

FIG. 28 is a cross-sectional view of a thin film transistor array panel according to the eighth exemplary embodiment of the present invention.

The thin film transistor array panel according to the eighth exemplary embodiment of the present invention includes a plurality of color filters 230 formed between the pixel electrodes 191 and the interlayer insulating layer 160, different from the sixth exemplary embodiment in which color filter 230 is formed above pixel electrode 191.

Color filters 230 are formed between the pixel electrodes 191 and the insulating layer 160 such that misalignment between the pixel electrodes 191 and the color filters 230 may be minimized when combining the thin film transistor array panel and the corresponding panel. Furthermore, because the pixel electrodes 191 cover the color filters 230, the pixel electrodes 191 prevent the color filters 230 from contacting with the liquid crystal material, thereby preventing contamination of the liquid crystal material.

The thin film transistor array panel according to the eighth exemplary embodiment of the present invention may be manufactured by adding a step of forming the color filters 230 after forming the interlayer insulating layer 160, in addition to the method for manufacturing the thin film transistor array panel according to the second exemplary embodiment The thin film transistor array panel according to the fourth exemplary embodiment of the present invention may also include a plurality of color filters 230 between the pixel electrodes 191 and the interlayer insulating layer 160.

Exemplary Embodiment 9

Figure 29:
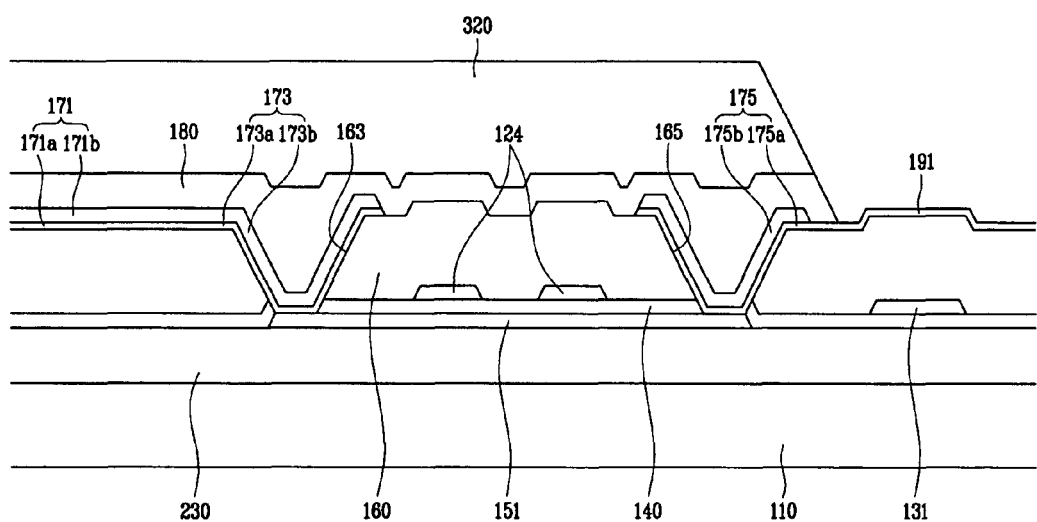
FIG. 29 is a cross-sectional view of a thin film transistor array panel according to a ninth exemplary embodiment of the present invention.

FIG. 29 is a cross-sectional view of a thin film transistor array panel according to the ninth exemplary embodiment of the present invention.

The thin film transistor array panel according to the ninth exemplary embodiment of the present invention includes a plurality of color filters 230 formed between the substrate 110 and the channel layers 151, different from the first exemplary embodiment. A blocking film (not shown) preferably made of silicon oxide or silicon nitride may be formed on the color filters 230.

Color filters 230 are formed between the substrate 110 and the channel layers 151 such that misalignment between the pixel electrodes 191 and the color filters 230 may be minimized when combining the thin film transistor array panel and the corresponding panel. Furthermore, because the various thin films cover the color filters 230, the thin films prevent the color filters 230 from contacting the liquid crystal material, thereby preventing contamination of the liquid crystal material.

The thin film transistor array panel according to the ninth exemplary embodiment of the present invention may be manufactured by adding a step of forming the color filters 230 before forming the channel layers 151, in addition to the method for manufacturing the thin film transistor array panel according to the first exemplary embodiment The thin film transistor array panel according to the third exemplary embodiment of the present invention may also include a plurality of color filters 230 formed between the substrate 110 and the channel layers 151.

Exemplary Embodiment 10

Figure 30:
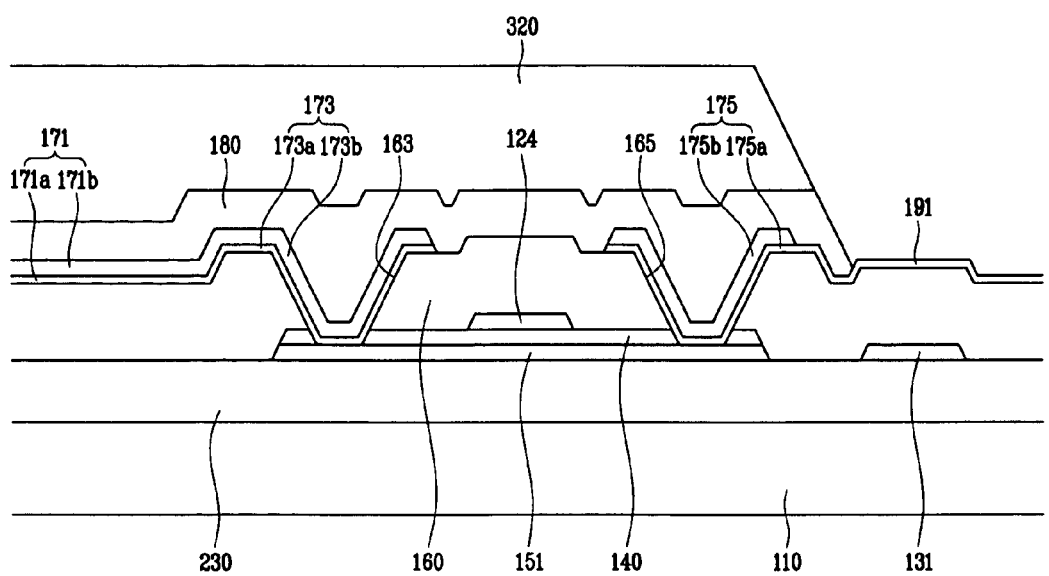
FIG. 30 is a cross-sectional view of a thin film transistor array panel according to a tenth exemplary embodiment of the present invention.

FIG. 30 is a cross-sectional view of a thin film transistor array panel according to the tenth exemplary embodiment of the present invention.

The thin film transistor array panel according to the tenth exemplary embodiment of the present invention includes a plurality of color filters 230 formed between the substrate 110 and the channel layers 151, different from the second exemplary embodiment. A blocking film (not shown) preferably made of silicon oxide or silicon nitride may be formed on the color filters 230.

Color filters 230 are formed between the substrate 110 and the channel layers 151 such that misalignment between the pixel electrodes 191 and the color filters 230 may be minimized when combining the thin film transistor array panel and the corresponding panel. Furthermore, because the various thin films cover the color filters 230, the thin films prevent the color filters 230 from contacting with the liquid crystal material, thereby preventing contamination of the liquid crystal material.

The thin film transistor array panel according to the tenth exemplary embodiment of the present invention may be manufactured by adding a step of forming the color filters 230 before forming the channel layers 151, in addition to the method for manufacturing the thin film transistor array panel according to the second exemplary embodiment The thin film transistor array panel according to the fourth exemplary embodiment of the present invention may also include a plurality of color filters 230 formed between the substrate 110 and the channel layers 151.

As above described, the source electrodes, the drain electrodes, and the pixel electrodes are simultaneously formed and the passivation layer and the spacer are formed together, and accordingly the number of masks for manufacturing the thin film transistor array panel may be reduced.

Furthermore, the lower layer of the source and drain electrodes are formed of a transparent conducting oxide, thereby improving the contact characteristics between the source and drain electrodes and the channel layers.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
   an insulating substrate;
   a channel layer including an oxide material formed on the insulating substrate;
   a gate insulating layer formed on the channel layer;
   a gate electrode formed on the gate insulating layer;
   an interlayer insulating layer formed on the gate electrode;
   a data line formed on the interlayer insulating layer, the data line including a source electrode, wherein the data line comprises a first conductive layer and a second conductive layer formed on the first conductive layer;
   a drain electrode formed on the interlayer insulating layer, the drain electrode including the first conductive layer and the second conductive layer formed on the first conductive layer;
   a pixel electrode comprising the first conductive layer; and
   a passivation layer formed on the data line and the drain electrode.

2. The thin film transistor array panel of claim 1, wherein the passivation layer extends above the data line, and includes a protruded portion covering the drain electrode.

3. The thin film transistor array panel of claim 1, further comprising:
   a spacer formed on the passivation layer,
   wherein the spacer has the same planar shape as the passivation layer.

4. The thin film transistor array panel of claim 1, further comprising:
   a spacer formed on the passivation layer,
   wherein the spacer covers less than all of the passivation layer.

5. The thin film transistor array panel of claim 4, wherein the gate insulating layer has substantially the same planar shape as the channel layer.

6. The thin film transistor array panel of claim 1, further comprising:
   a storage electrode line formed on a portion of the substrate, except on the gate insulating layer, and intersecting the data line.

7. The thin film transistor array panel of claim 1, further comprising:
   a color filter formed on the pixel electrode.

8. The thin film transistor array panel of claim 1, further comprising:
   a color filter formed between the interlayer insulating layer and the pixel electrode.

9. The thin film transistor array panel of claim 1, further comprising:
   a color filter formed between the substrate and the channel layer.

10. The thin film transistor array panel of claim 1, wherein the gate insulating layer has substantially the same planar shape as the channel layer.

11. The thin film transistor array panel of claim 10, further comprising:
    a storage electrode line formed on the substrate.

12. The thin film transistor array panel of claim 10, further comprising:
    a color filter formed on the pixel electrode.

13. The thin film transistor array panel of claim 10, further comprising:
    a color filter formed between the interlayer insulating layer and the pixel electrode.

14. The thin film transistor array panel of claim 10, further comprising:
    a color filter formed between the substrate and the channel layer.

15. A thin film transistor array panel comprising:
    an insulating substrate;
    a channel layer including an oxide material formed on the insulating substrate;
    a gate insulating layer formed on the channel layer;
    a gate line formed on the gate insulating layer;
    an interlayer insulating layer formed on the gate line;
    a data line including a source electrode and a drain electrode formed on the interlayer insulating layer;
    a pixel electrode formed on the interlayer insulating layer, and connected to the drain electrode;
    a passivation layer formed on the data line and the drain electrode; and
    a spacer formed on the passivation layer,
    wherein the passivation layer is coextensive with the data line and includes a portion covering the drain electrode, and
    at least a part of a boundary of the spacer is the same as a boundary of the passivation layer.

16. The thin film transistor array panel of claim 15, wherein the spacer has the substantially same planar shape as the passivation layer.

17. The thin film transistor array panel of claim 15, wherein the spacer covers less than all of the passivation layer.

18. The thin film transistor array panel of claim 1, wherein the first conductive layer comprises a transparent conducting oxide and the second conductive layer comprises a metal.

* * * * *